United States Patent

Page et al.

[15] 3,652,907

[45] Mar. 28, 1972

[54] THIN FILM POWER FET

[72] Inventors: Derrick J. Page; Thomas P. Brody, both of Pittsburgh, Pa.

[73] Assignee: Westinghouse Electric Corporation, Pittsburgh, Pa.

[22] Filed: May 5, 1970

[21] Appl. No.: 34,842

[52] U.S. Cl. ....................317/235 R, 317/235 B, 317/234 S, 317/234 M, 317/234 N, 317/235 G

[51] Int. Cl. ....................H01l 11/14

[58] Field of Search...........317/235 B, 234 S, 234 M, 234 N, 317/235 G

[56] References Cited

UNITED STATES PATENTS

| | | | |
|---|---|---|---|
| 3,423,821 | 1/1969 | Nishimura | 29/571 |
| 3,414,781 | 12/1968 | Dill | 317/235 |
| 3,368,123 | 2/1968 | Rittmann | 317/235 |

OTHER PUBLICATIONS

Weimer, Proceedings of the IRE, June 1962, pages 1,462–1,467

*Primary Examiner*—John W. Huckert
*Assistant Examiner*—Martin H. Edlow
*Attorney*—F. Shapoe and C. L. Menzemer

[57] ABSTRACT

This disclosure is concerned with a thin film, power field effect transistor having a power dissipation capability of 80 watts/cm.[2]. The transistor has a thin film interdigitated source and drain used in conjunction with a thick film source and drain leads. The thick film source and drain leads essentially eliminates negative feedback resulting from a voltage drop in the source and drain.

5 Claims, 7 Drawing Figures

WITNESSES
Theodore F. Wrobel
James F. Young

INVENTORS
Thomas P. Brody and
Derrick J. Page
BY C. L. Menzemer
ATTORNEY

THIN FILM POWER FET

BACKGROUND OF THE INVENTION

1. Field of the Invention

This invention is in the field of thin film semi-conductor devices and in particular is concerned with a thin film power field effect transistor.

Description of the Prior Art

Thin film FET devices are known in the art. However, such devices are low power switches which generally are only able to handle a current measured in microamperes.

Attempts to utilize such switches as power devices have not been successful because the devices must be physically too large to be practical and heat dissipation has presented a problem.

SUMMARY OF THE INVENTION

In accordance with the present invention there is provided a thin film, power, field effect transistor comprising; an electrically and thermally conductive substrate, a layer of an electrically insulating, thermally conducting material on at least the top surface of the substrate, a source, a drain, said source and drain disposed on said layer of electrically insulating, thermally conducting material, said source and drain being spaced apart from each other and having an interdigitated relationship relative to each other, said source and drain each consisting of a thick film lead portion and a thin film contact portion, said contact portion of said source and said drain each being disposed over and completely covering said lead portion, and a thin film of a semiconductor material in contact with said source and drain and in contact with said layer of electrically insulating and thermally conducting material at least in the space between said source and drain.

BRIEF DESCRIPTION OF THE DRAWING

The invention will become more readily apparent from the following exemplary description in connection with the accompanying drawings, wherein.

DESCRIPTION OF THE PREFERRED EMBODIMENT

Figure 1:
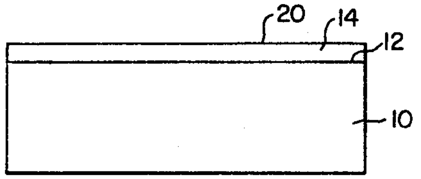
FIG. 1 is a side view of a substrate suitable for use in accordance with the teachings of this invention.

With reference to FIG. 1, there is shown a substrate 10 suitable for use in accordance with the teachings of this invention. The substrate 10 may be flexible, semi-rigid or rigid and may consist of a metal foil, metal tape or a body of metal selected from the group consisting of nickel, aluminum, copper, tin, molybdenum, tungsten, tantalum, beryllium, silver, gold platinum, magnesium, base alloys of any of these, and ferrous base alloys. Aluminum is a particularly good substrate material. The substrate serves as the gate of the FET.

While the thickness of the substrate is not critical, if a metal foil or tape is employed a practical minimum thickness is 200 A.

On at least top surface 12 of substrate 10, there is formed a layer 14 of an electrically insulating, thermally conducting material.

The layer 14 may be an oxide of the metal comprising the substrate as for example aluminum oxide; titanium oxide; glasses such for example lead silicates, lead borates, lead borosilicates and mixtures thereof; and cured resins such for example as epoxy resins, polyester resins, silicon resins and polyurethane resins. The resins may be filled with up to about 20 percent, by weight, of 40 to 50 mesh electrical insulating, thermal conducting filler such for example anodized aluminum particles or beryllium oxide particles.

The preferred material for layer 14, when the substrate 10 is aluminum, is aluminum oxide. Such oxide may be formed by either plasma anodization or wet anodization. The layer must be a dense, non-porous oxide. Accordingly, a particular good method of anodizing the substrate is to deploy the substrate in a bath of a 9 percent solution of chromium trioxide for 5 minutes using a voltage of 40 volts. A 9 percent solution consists of 72 grams of chromium trioxide in 800 ml. of water.

For the power FET of this invention, layer 14 should have a thickness of from 500 A to 4,000 A and preferably about 1,000 A if the FET is to handle from 10 volts to 50 volts. A thickness of about 10,000 A is required for an operating voltage of 300 volts and a thickness of about 20,000 A for an operating voltage of 600 volts.

Figure 2:
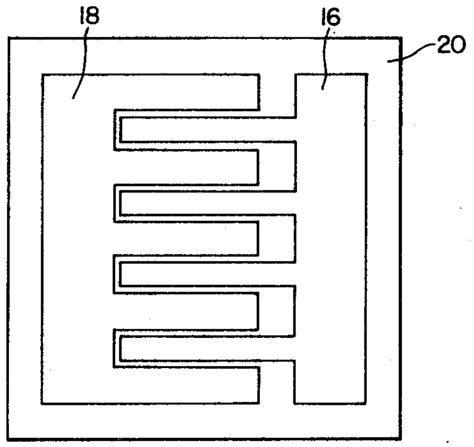
FIGS. 2 and 3 are top views of the substrate of FIG. 1 being processed in accordance with the teachings of this invention.

With reference to FIG. 2, a source lead 16 and a drain lead 18 are deposited on top surface 20 of layer 14.

The source lead 16 and drain lead 18, which are interchangeable, are formed on surface 20 by the silk screen process which is well known to those skilled in the art.

The leads 16 and 18 may consist of an admixture of palladium and silver, palladium and gold, or gold. The leads 16 and 18 may be deposited from any suitable silk screen printing solution such for example as one having the following composition:

| Ingredient | | |
|---|---|---|
| silver powder | 56.4 | 75% solids |
| palladium black | 14.1 | |
| bismuth oxide | 3.0 | |
| borosilicate glass | 1.5 | |
| ethyl cellulose | 3.6 | 25% vehicle |
| -2 furoic acid | 1.6 | |
| butyl carbitol acetate | 17.3 | |
| $CH_3(CH_2)_8$ 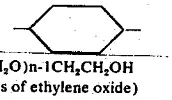 $O(CH_2CH_2O)n\text{-}1CH_2CH_2OH$ (n is moles of ethylene oxide) | 2.5 | |

After deposition the substrate is heated to drive off the vehicle portion, thereby leaving the source and drain leads 16 and 18 deposited on surface 20.

The source and drain leads 16 and 18 are thick films, that is a film having a thickness of from 0.1 to 5 mils. Preferably for the power FET of this invention the source and drain leads have a thickness of about one mil.

The thick film leads 16 and 18 are not in themselves suitable for use as source and drain contacts. The distance between the source and drain contacts determines the operating condition of the FET. The shorter the distance between source and drain the higher will be the "on-off" ratio of the device. However, thick film process tolerances are 2 to 3 mils, and thus do not provide the high resolution necessary for providing accurately spaced source and drain. The necessity and importance of the thick film source and drain lead in the device of this invention will be explained in detail below.

Figure 3:
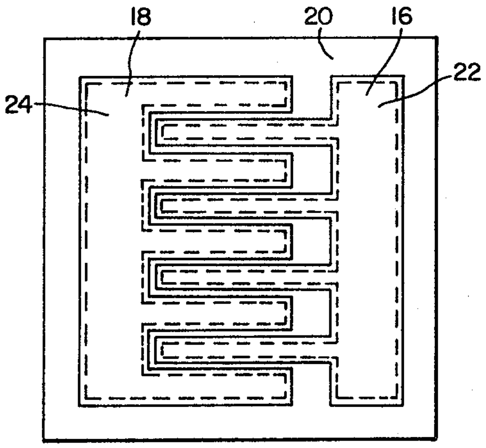

With reference to FIG. 3, source and drain contacts 22 and 24 are disposed over the source and drain leads 16 and 18 respectively. The contacts 22 and 24 completely enclose the leads 16 and 18 on both sides and top.

The contacts 22 and 24 may consist of any metal which forms an ohmic contact with a selected semiconductor material and examples include gold, nickel, silver, indium, aluminum and base alloys thereof. Certain metals are preferred when using particular semiconductor materials, for example, it is preferred to use either gold or nickel with tellurium and indium with either cadmium sulfide or cadmium selenide.

The contacts 22 and 24 are thin films, having a thickness which may range from as low as 200 A to over 1,000 A. The thickness being controlled by the desired operating current.

The thin film contacts 22 and 24 are deposited using metal masks in the manner described in U.S. Pat. application, Ser. No. 745,039, filed July 15, 1968, the assignee of which is the same as that of the present application.

The lead and contact of the source and drain together form a source and a drain electrode.

Such a method, employing metal masks, provides a method of obtaining accurate resolution and the spacing between the source and drain contacts can be accurately controlled. The spacing between source and drain in an FET is called the channel and controls the amount of current a device can handle. A rough approximation is that 1 mm. of channel width is required for 10 ma. of current. A 1 ampere device requires a channel width of 10 cm. which by using an interdigitated source and drain can be compacted into an area of one-quarter inch square.

Figure 4:
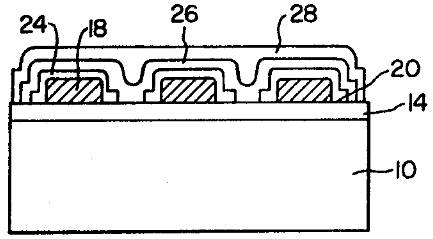
FIG. 4 is a side view of the device of this invention.

With reference to FIG. 4, again following the teaching set forth in U.S. Pat. application, Ser. No. 745,039 and employing a metal mask a layer 26 of a semiconductor material is disposed over the top surface 20 of layer 14 and the source and drain contacts. The important and critical portion of the semiconductor material is that disposed between adjacent source and drain contact fingers.

The layer 26 may consist of a semiconductor material of either P- or N-type such as for example tellurium (P-type), lead telluride (P-type or N-type), cadmium sulfide (N-type), cadmium selenide (N-type), indium arsenide (N-type), gallium arsenide (N-type), and tin oxide (N-type). The layer 18 may be single crystal, polycrystal, or amphous.

The thickness of layer 26 of semiconductor material may vary from an average thickness of about 40 A. to about 130 A. for tellurium and even higher for higher resistivity materials such as cadmium sulfide going up to 2,000 A. The device thus produced is a power FET.

If desired, the FET thus produced may be sealed from the ambient by depositing a layer 28 of an essentially air tight electrically insulating material, such for example aluminum oxide or an epoxy resin over the entire structure.

Figure 5:
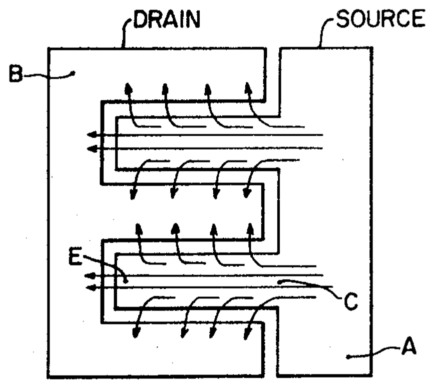
FIG. 5 is a top view of an interdigitated source and drain schematically showing current flow in a FET; and, FIGS. 6 and 7 are schematic diagrams of FET device.

The power handling capability of the device of this invention as opposed to an FET switch of exclusively thin film FET can be understood by reference to FIG. 5 where there is shown an interdigitated thin film source and drain. Current enters the source at A and leaves the drain at B. The current flows into each of the fingers of the source (as indicated by the arrows) through the channel between the source and drain and into the drain.

Figure 6:
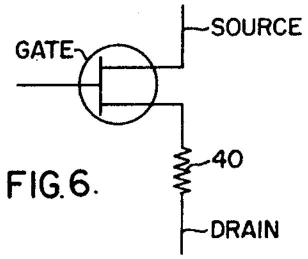

If the length of the fingers is for example one inch, the current density at point C, the beginning of any of the fingers is large and the voltage drop between C and E is large. The large voltage drop results in negative feedback and cuts down the gain of the device. This effect is shown in FIG. 6 where at a schematic diagram of an FET is shown, the voltage drop between C and E can be considered as a resistance 40 in the drain of the FET.

Figure 7:
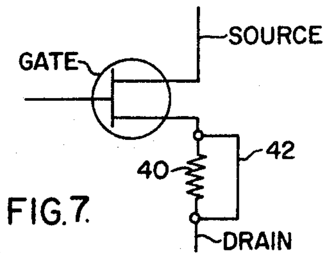

The problem of high voltage drop in the fingers of the source and drain is overcome in the present invention by using the thick film source and drain leads. The thick film provides a low resistance path for the current through the fingers and the result is shown in FIG. 7. In effect, the thick film leads provide a shunt 42 around the resistance 40.

The thick film leads permit the device of this invention to handle currents of 10 amperes at voltages of from 10 to 50 volts.

Further, by securing the substrate 10 to a heat sink or actually producing the device itself on the surface of a heat sink, the device could operate at a peak power of 200 watts.

In a modified form, the device of this invention can be prepared with the layer of semiconductor material deposited directly onto the layer 14, and the source and drain leads and contacts disposed on the layer of semiconductor material.

What we claim is:

1. A thin film power field effect transistor comprising:
an electrically and thermally conductive substrate,
a layer of an electrically insulating, thermally conducting material on at least the top surface of the substrate,
a metal source electrode,
a metal drain electrode,
said source and drain disposed on said layer of electrically insulating, thermally conducting material,
said source and drain being spaced apart from each other and having an interdigitated relationship relative to each other,
said source and drain electrode each consisting of a thick film metal electrical lead portion and a thin film metal electrical contact portion,
said contact portion of said source and said drain each being disposed over and completely covering said lead portion said source and drain leads have a thickness of from 0.1 to 5 mils and the source and drain contacts have a thickness of from 200 A to 1,000 A,
and, a thin film of a semiconductor material in contact with said source and drain electrodes and in contact with said layer of electrically insulating and thermal conducting material at least in the space between said source and drain electrodes.

2. The transistor of claim 1 in which the substrate is aluminum and the layer of electrically insulating, thermally conductive material is aluminum oxide.

3. The transistor of claim 1 in which the layer of semiconductor material is disposed over the source and drain electrode.

4. A thin film power field effect transistor of claim 1 in which input current and output current is electrically shunted around electrical resistance of thin film source and drain contacts by employing thick film source and drain leads under the thin film source and drain contacts.

5. A thin film power field effect transistor comprising:
an electrically and thermally conductive substrate,
a layer of an electrically insulating, thermally conducting material on at least the top surface of the substrate,
a thin film of a semiconductor material disposed on said layer of electrically insulating, thermally conductive material,
a metal source electrode,
a metal drain electrode,
said source and drain being disposed on said layer of semiconductor material,
said source and drain being spaced apart from each other and having an interdigitated relationship relative to each other,
said source and drain electrode each consisting of a thick film metal electrical lead portion and a thin film metal electrical contact portion, and
said contact portion of said source and said drain each being disposed over and completely covering said lead portion said source and drain leads have a thickness of from 0.1 to 5 mils and the source and drain contacts have a thickness of from 200 A to 2,000 A.

* * * * *